US012801799B2

(12) United States Patent
Klemmt

(10) Patent No.: US 12,801,799 B2
(45) Date of Patent: Nov. 17, 2026

(54) METHOD FOR THE TOPOLOGY OPTIMIZATION OF TRUSSES

(71) Applicant: Christoph Klemmt, Cincinnati, OH (US)

(72) Inventor: Christoph Klemmt, Cincinnati, OH (US)

( * ) Notice: Subject to any disclaimer, the term of this patent is extended or adjusted under 35 U.S.C. 154(b) by 795 days.

(21) Appl. No.: 18/352,295

(22) Filed: Jul. 14, 2023

(65) Prior Publication Data

US 2024/0037288 A1 Feb. 1, 2024

Related U.S. Application Data

(60) Provisional application No. 63/393,299, filed on Jul. 29, 2022.

(51) Int. Cl.
*G06F 30/13* (2020.01)
*G06F 30/23* (2020.01)

(52) U.S. Cl.
CPC .............. *G06F 30/13* (2020.01); *G06F 30/23* (2020.01)

(58) Field of Classification Search
CPC ................................. G06F 30/13; G06F 30/23
See application file for complete search history.

(56) References Cited

U.S. PATENT DOCUMENTS

2016/0253444 A1* 9/2016 Rodrigues .............. B64G 99/00 703/2
2022/0268048 A1* 8/2022 Miller ..................... E04H 12/08

OTHER PUBLICATIONS

Luo, Ruifeng, and Xianzhong Zhao. "An innovative hybrid topology optimization method for truss structures based on a combination of continuous and discrete topology optimization." Proceedings of IASS Annual Symposia. vol. 2020. No. 22. International Association for Shell and Spatial Structures (IASS) (Year: 2020).*
Luo, Ruifeng, et al. "Alpha Truss: Monte Carlo tree search for optimal truss layout design." Buildings 12.5 (2022): 641. (Year: 2022).*
R. Arora, A. Jacobson, T. R. Langlois, Y. Huang, C. Mueller, W. Matusik, A. Shamir, K. Singh and D. I. W. Levin, "Volumetric Michell Trusses for Parametric Design&Fabrication" in Proceedings: SCF 2019—ACM Symposium on Computational Fabrication, 2019.
A. Felder, "Microstructural Components of Bone Tissue—Scaling and Biomimetics," Ph.D dissertation, The Royal Veterinary College, The University of London, 2018.
W. Dorn, R. Gomory and H. Greenberg, "Automatic design of optimal structures," Journal de Mécanique, vol. 3, No. 1, pp. 25-52, 1964.
J. M. Oberndorfer, W. Achtziger and H. R. E. M. Hörnlein, "Two approaches for truss topology optimization: a comparison for practical use," Structural Optimization, vol. 11, No. 3-4, pp. 137-144, 1996.

(Continued)

*Primary Examiner* — Chuen-Meei Gan

(57) ABSTRACT

The present invention is for a computer-executed method for the generation or topology optimization of load-bearing trusses. The trusses consist of joints that are connected by linear structural elements, with at least one support and one load that the truss is to support. Based on a finite element analysis of the current state of the truss, the truss is iteratively improved by adjusting its topology, its geometry, and optionally the sizing of its members.

19 Claims, 8 Drawing Sheets

(56) References Cited

OTHER PUBLICATIONS

U. Kirsch, "Integration of reduction and expansion processes in layout optimization," Structural Optimization, vol. 11, pp. 13-18, 1996.
W. Achtziger, "On simultaneous optimization of truss geometry and topology," Structural and Multidisciplinary Optimization, vol. 33, No. 4-5, pp. 285-304, 4 2007.
T. Sokół, "A 99 line code for discretized Michell truss optimization written in Mathematica", Structural and Multidisciplinary Optimization, vol. 43, No. 2, pp. 181-190,2 2011.
T. Sokół, "Topology optimization of large-scale trusses using ground structure approach with selective subsets of active bars," in 19th International Conference on Computer Methods in Mechanics, 2011.
T. Sokół and G. I. N. Rozvany, "On the adaptive ground structure approach for multi-load truss topology optimization,"in 10th World Congress on Structural and Multidisciplinary Optimization, 2013.
L. He and M. Gilbert, "Rationalization of trusses generated via layout optimization," Structural and Multidisciplinary Optimization, vol. 52, No. 4, pp. 677-694, 10 2015.
L. He, T. Pritchard, J. Maggs, M. Gilbert and H. Lu, "Peregrine User Manual," Sheffield, LimitState Limited, 2021.
G. Steven, O. Querin and M. Xie, "Evolutionary structural optimisation (ESO) for combined topology and size optimisation of discrete structures," Computer methods in applied mechanics and engineering, vol. 188, No. 4, pp. 743-754, 2000.
C. Preisinger, R. Vierlinger, A. Hofmann and K. Bollinger, "Evolutionary Structural Optimization Revisited," IASS Morphology, 2011.
K. Shea, J. Cagan and S. J. Fenves, "A Shape Annealing Approach to Optimal Truss Design with Dynamic Grouping of Members," Transactions of the ASME, vol. 119, pp. 388-394, 1997.
W. K. Rule, "Automatic Truss Design by Optimized Growth," Journal of Structural Engineering, vol. 120, No. 10, pp. 3063-3070, 1994.
J. J. Mckeown, "Growing optimal pin-jointed frames," Structural Optimization, vol. 15, pp. 92-100, 1998.
D. Bojczuk and Z. Mróz, "Optimal topology and configuration design of trusses with stress and buckling constraints," Structural Optimization, vol. 17, pp. 25-35, 1999.
M. Gilbert and A. Tyas, "Layout optimization of large-scale pin-jointed frames," Engineering Computations (Swansea, Wales), vol. 20, No. 7-8, pp. 1044-1064, 2003.
T. Hagishita and M. Ohsaki, "Topology optimization of trusses by growing ground structure method," Structural and Multidisciplinary Optimization, vol. 37, No. 4, pp. 377-393, 1 2009.
P. Martínez, P. Martí and O. M. Querin, "Growth method for size, topology, and geometry optimization of truss structures," Structural and Multidisciplinary Optimization, vol. 33, No. 1, pp. 13-26, 2007.
T. H. Kwok, Y. Li and Y. Chen, "A structural topology design method based on principal stress line," CAD Computer Aided Design, vol. 80, pp. 19-31, 11 2016.
S. D. Larsen, O. Sigmund and J. P. Groen, "Optimal truss and frame design from projected homogenization-based topology optimization," Structural and Multidisciplinary Optimiza tion, vol. 57, No. 4, pp. 1461-1474, 4 2018.

* cited by examiner

METHOD FOR THE TOPOLOGY OPTIMIZATION OF TRUSSES

TECHNICAL FIELD

The present embodiments relate to structural engineering and specifically to the design of load-bearing structures by means of a computer-executed topology optimization (TO).

BACKGROUND

The automated design of load-bearing structures is commonly executed on a computer. The aim is usually the design of a structure that can withstand the defined loads with a minimum of mass or production cost. Applications include but are not limited to architecture, civil engineering, mechanical engineering, aerospace engineering or biomedical engineering.

The structures or digital structural models are usually defined as trusses by point locations of the nodes in 2D or 3D space, which are connected by linear structural elements, linear beams, or beams. The computer algorithms for this automated structural design are usually based on finite element analysis (FEA) to calculate the forces in each beam, a computational method for the analysis of a structure.

Supports, loads, and a design domain need to be defined that the structure is to be contained in. An initial structure is either given as an input or generated in the first step. The initial structure is then optimized by either one, or a combination, of the following: an optimization of sizing, whereby structural elements are assigned different cross-sections to withstand their different load requirements and possibly be removed; an optimization of geometry, whereby the positions of the nodes are adjusted that define the elements of the structure; or an optimization of topology, whereby nodes and elements are added or removed from the structure.

A common method for automated structural design is a voxel-based TO, whereby the point locations that define the structure are arranged in a regular voxel grid with either solid or void voxels. Iteratively, an FEA is calculated, and solid voxels are added or removed from the model as needed. The resulting structure is a solid volume that requires postprocessing if it is to be constructed from linear beams. Another method is the Ground Structure method which starts with a large amount of beams that fill the design domain, with underutilized beams iteratively removed based on an FEA.

BRIEF SUMMARY

The present invention encompasses a non-transitory computer-readable medium comprising code or instructions that, when executed, at least cause or enable a topology optimized network of linear beams. The present invention is reliant on steps of both an optimization of topology and an optimization of geometry, with an optional optimization of sizing. The current invention is based on a free-form arrangement of linear beams in two or three dimensions, and does not use a regular voxel grid.

The present invention optimizes a given or initially generated structural model according to given supports, loads and a design domain. The present invention does so by iteratively adjusting the topology of the structural model through the insertion of new nodes and structural elements into the model, and optional removal of nodes and elements from the model, according to an FEA, and by adjusting the geometry of the structural model by moving the node locations according to an FEA. The FEA is calculated as part of the setup and re-calculated after each step of the optimization process. An optimization of sizing can be executed iteratively or as post-processing.

DETAILED DESCRIPTION OF THE INVENTION

Most existing methods of TO are based on a voxel grid, with the resulting model being a solid volume of often complex geometry. As many structures are constructed from discrete components such as linear beams, it can require extensive post processing to turn the solid geometry into discrete members. On the contrary, the Ground Structure method uses linear beams instead, whereby beams are removed from an initially dense field of interconnected nodes. This has limitations on the computational power required to calculate the initial large amount of beams, and it is difficult to create local areas of higher beam density than the initial global density.

The present invention instead uses the concept of cell-based growth as observed in nature, whereby complex organisms, as well as the structural systems that support them such as trabecular bone or the veins of leaves, develop through cell division, while continuously exposed to external forces that influence their growth.

Figure 1:
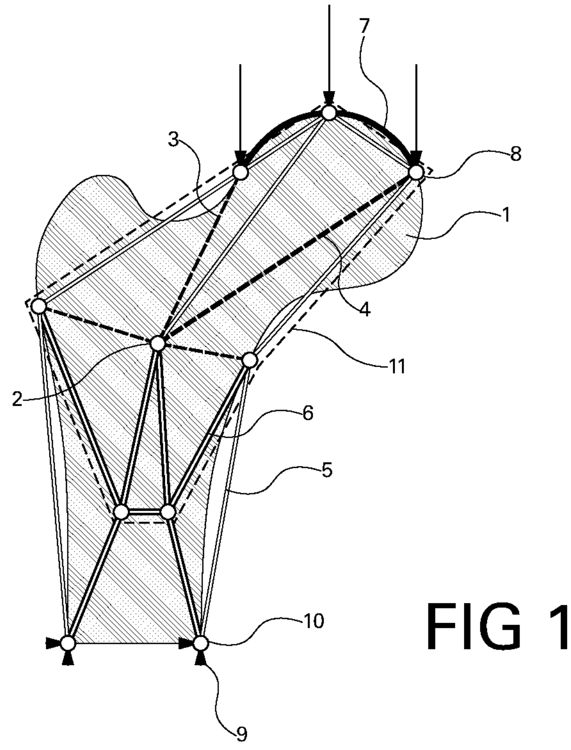
FIG. 1 is the diagram of the main components that make up a structural model in 2 dimensions.

The present invention uses a structural model that uses the components shown in FIG. 1 for a 2-dimensional model. It is described by a design domain 1 that contains nodes 2 that are connected by linear beams 3, 4, 5, 6. Beams in tension 3, 4 are shown dashed while beams in compression 5, 6 are shown as double lines, with beams under stronger load 4, 6 drawn thicker. A structural design task with at least one load case must be given that includes at least one load 7 that connects to load nodes 8 and at least one support 9 that connects to support nodes 10. The nodes of the model can either be moment resisting or not. The initial model or truss must include at least four nodes and at least six beams.

Figure 2:
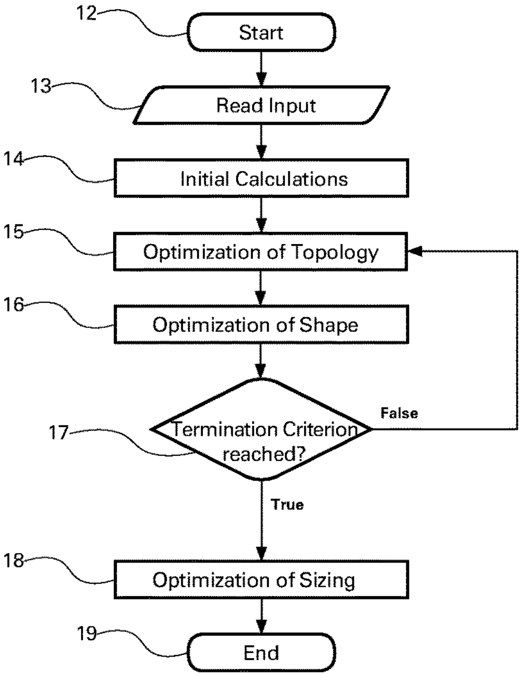
FIG. 2 is the flow chart of the method in one embodiment of the present invention.
Figure 3:
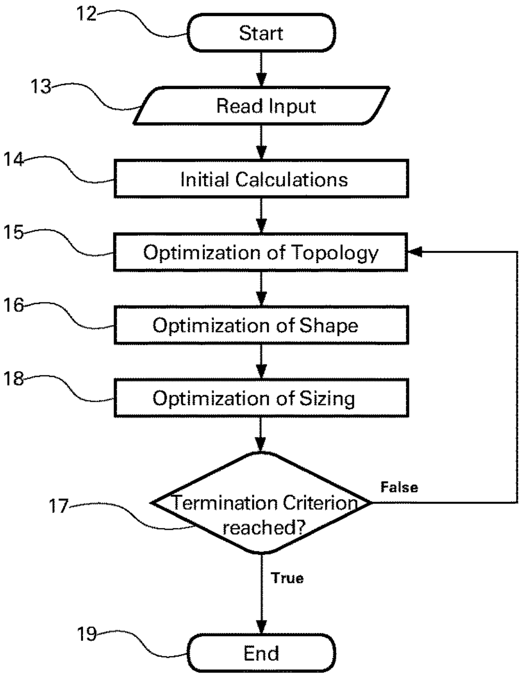
FIG. 3 is the flow chart of the method in another embodiment of the present invention.

Flowcharts of two embodiments of the present invention are shown in FIG. 2 and FIG. 3. Upon the start 12 of the method, the load cases are read as an input 13. An initial model can be given as an input in 13 that connects all loads and all supports to at least one central node and that can be calculated by an FEA, or an initial model with those constraints can be generated by the present invention in 14. Initial cross-sections for the structural members can be given in 13 or can be assigned by the present invention in 14. An FEA is calculated for the initial model in 14.

Once the initial model is set up, cycles of alternating steps of adjustments or optimizations of topology 15 and of geometry 16 are carried out. At least one step of topology optimization has to be carried out before the next step of geometry optimization is carried out. At least one, but possibly several steps of geometry optimization have to be carried out before the next step of topology optimization is carried out.

For each step of the optimization of topology in 15, based on the previous FEA at least one node and one element, but possibly several elements, are inserted or removed from the model. Nodes in close proximity to the inserted or removed elements can be repositioned. Each step of the optimization of topology is followed by an FEA analysis of the updated model.

For each step of optimization of geometry in 16, the nodes 2 of the model reposition according to the previous FEA, with at least one node being repositioned. The nodes are required to remain within the design domain 1. Node positions may need to be adjusted so that the linear beams connecting them remain fully within a convex design domain. Nodes at supports 10 or loads 8 may be required to remain at their position or on the geometry that defines the support 9 or load 7. In order to avoid a crossing of beams, nodes may be required to remain within the concave polygon in 2D such as 11 for node 2, or volume in 3D, that is defined by the neighboring nodes that directly surround it. Each step of the optimization of geometry is followed by an FEA analysis of the updated model.

The optimization process can be terminated once the model reaches a performance criterion, such as an acceptable mass or acceptable maximum displacement, or after a certain amount of iterations or time have passed 17. An adjustment or optimization of the sizing of each element's cross-section 18 can be carried out as part of every iteration as per the flowchart in FIG. 2, or after the termination of the topology and geometry optimization as per the flowchart in FIG. 3. The cross section includes a cross section geometry and material definition, and can include the removal of an element by assigning a zero-mass cross section. The present invention terminates after the output of the final structural model in 19.

Figure 4:
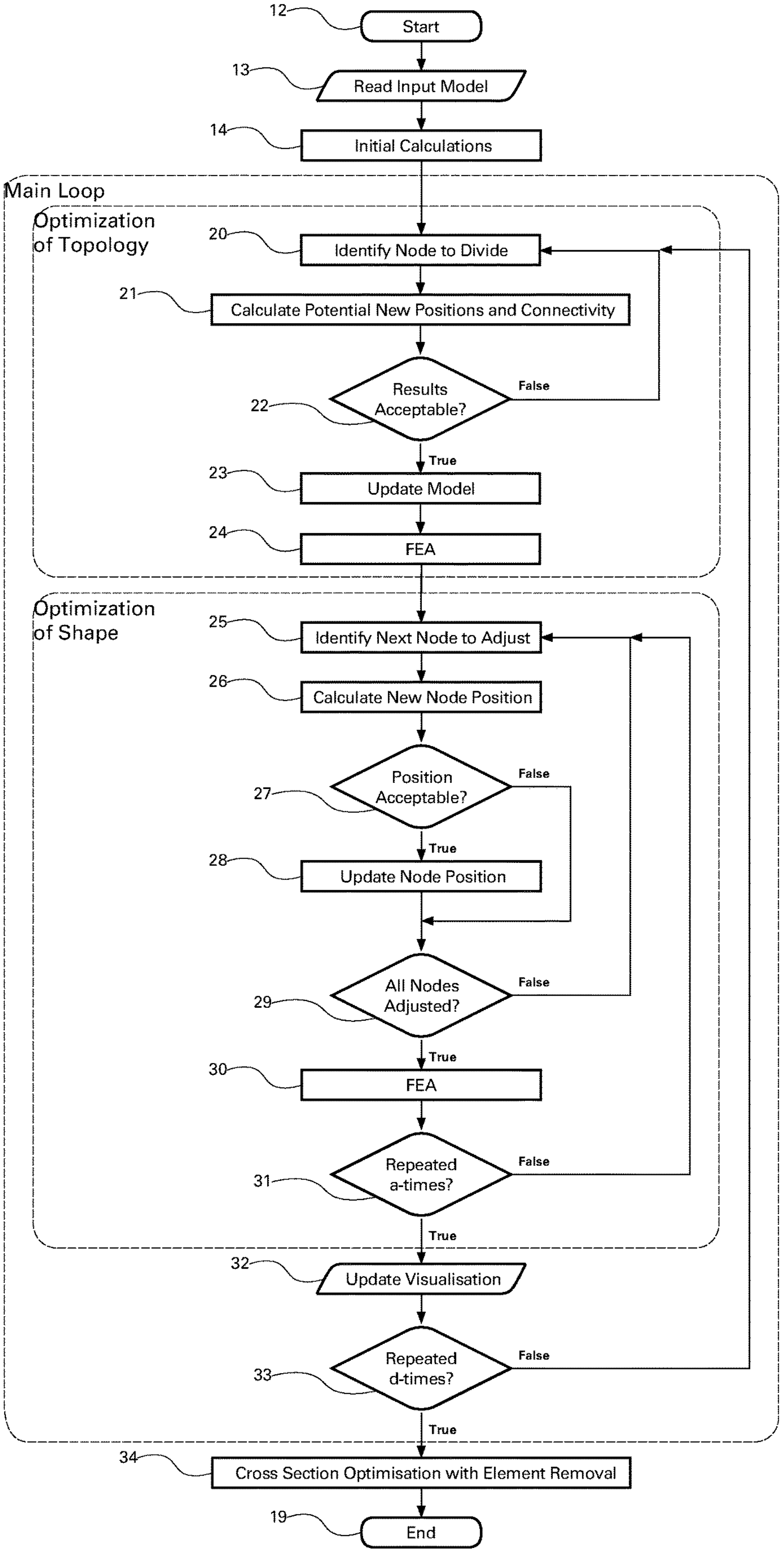
FIG. 4 is the flow chart of the method in the preferred embodiment of the present invention.

A flowchart of some embodiments of the present invention is shown in FIG. 4. In some embodiment of the invention, a single step of topology optimization is carried out. Based on the FEA, the strongest loaded node is identified for a node division in 20, according to the sum of the strength of the normal forces of each element at a node. A new node is inserted adjacent to it, the nodes are repositioned, and the beam connections to their surrounding nodes are adjusted 21. If the division causes an error or an unsuitable result, the next highest loaded node is divided instead 22. Otherwise, the topological changes are accepted 23 and an FEA is calculated for the updated model 24. In those embodiments of the invention, a removal of elements and nodes is not carried out as part of the step of topology optimization.

For the optimization of geometry, each node is selected one by one 25, and its new position calculated 26. If this new position is acceptable and does not cause any errors or problematic topology or geometry 27, the position of the node is updated 28. This is carried out until a repositioning was attempted for each node 29, then an updated FEA is calculated 30. This step of geometry optimization can be carried out several times 31. In some embodiments of the invention, 6-10 steps of geometry optimization are carried out for every step of topology optimization.

In some embodiments of the invention, a visualization can be updated 32. In some embodiments of the invention the optimization of topology and geometry is terminated after a certain amount of iterations have passed 33. An optimization of the sizing of each element's cross-section is carried out after the termination of the topology and geometry optimization 34. As part of this process, the least structurally utilized elements are removed from the structural model. At the termination of the method, the final structural model is returned 19.

Figure 5:
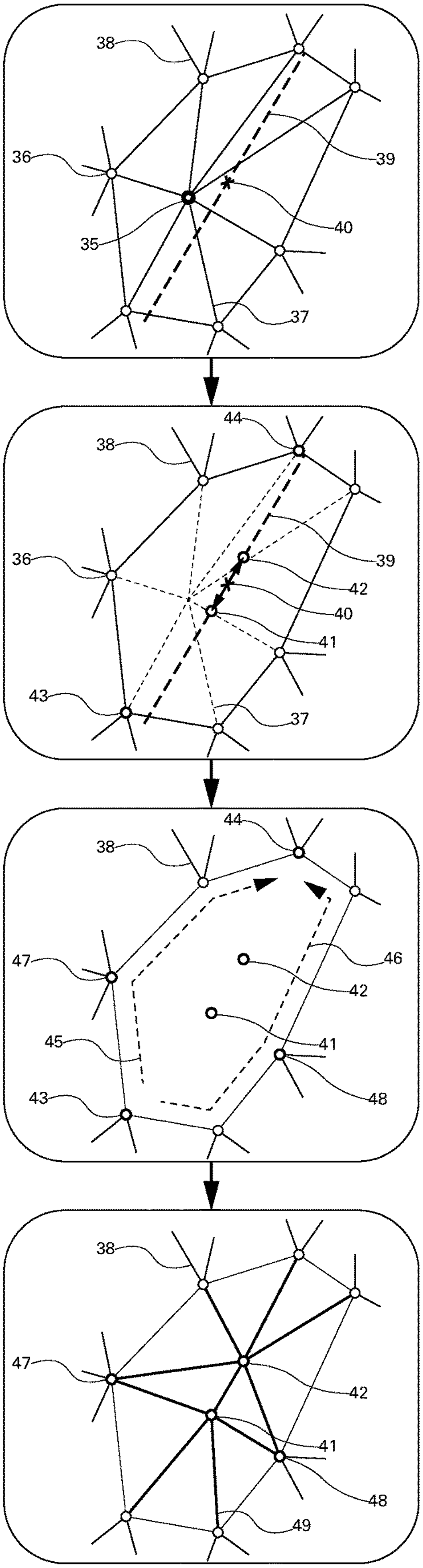
FIG. 5 is the diagram of one step of the topology optimization via a node division.

The preferred embodiment of the present invention uses the method of topology optimization by node division as shown in FIG. 5. The dividing node 35 is surrounded by neighboring nodes 36, that it is connected to by the linear beams 37 before the division. Further beams 38 connect the neighboring nodes to the rest of the structural model. The best-fit-curve or regression-curve 39 through the neighboring nodes has the midpoint 40. A new node is inserted into the model, and the dividing node and new node are placed at positions 41 and 42 respectively at an offset from the midpoint 40 along the regression curve 39 in opposite directions. In the preferred embodiment of the present invention, the offset is one tenth of the length of the regression curve. Two nodes 43 and 44 are closest to the two endpoints of the regression curve. Two chains of nodes connected by beams lead from one 43 to the other 44 along the directions 45 and 46. Those chains each have a mid node, 47 and 48. New beams 49 are inserted so that the mid nodes 47 and 48 connect to both the dividing node 41 and new node 42, while the remaining neighboring nodes are connected to the closer of the two nodes 41 and 42.

In the preferred embodiment of the present invention, the geometry optimization uses three behaviors or criteria to define the new position of each node: an Alignment behavior, an Angulation behavior, and an Equalization behavior. Each of the behaviors results in one or more movement vectors for each node. Those are scaled by strength factors and by factors relating to the strength of the forces that act in the beams they are based on, and added to the node's previous position to define its new position. A node at position P shall have k neighboring nodes n_i,i=1, . . . ,k and k connecting beams e_i,i=1, . . . ,k, each with the normal force N_i,i=1, . . . ,k as calculated by the FEA.

In the preferred embodiment of the present invention, the Alignment behavior attempts to straighten the two strongest beams in compression and the two strongest beams in tensions that meet at a node at angles >0.5π, as per Equation 1.

$$behaviorAlignment = strengthAlignment * \left( \max_{\substack{0 \le i < k \\ i < j \le k}} (\hat{e}_i + \hat{e}_j) * (N_i + N_j) \text{ if}(e_i \cdot e_j < 0 \,\&\, N_i > 0 \,\&\, N_j > 0) + \max_{\substack{0 \le i < k \\ i < j \le k}} (\hat{e}_i + \hat{e}_j) * (|N_i| + |N_j|) \text{ if}(e_i \cdot e_j < 0 \,\&\, N_i < 0 \,\&\, N_j < 0) \right) \quad (1)$$

Figure 6:
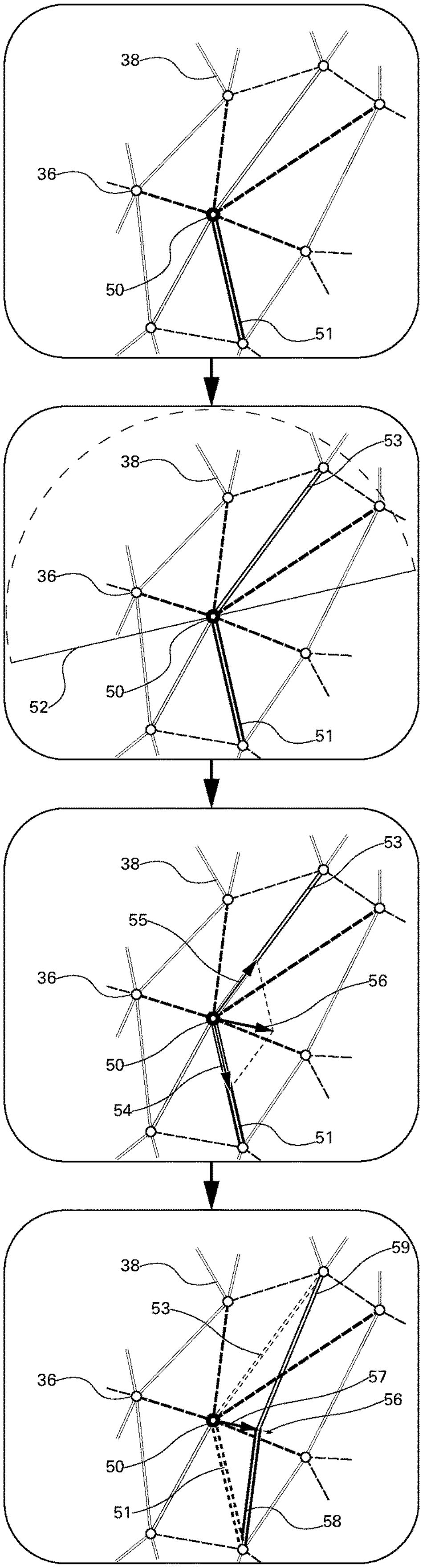
FIG. 6 is the diagram of the Alignment behavior.

FIG. 6 shows, for the preferred embodiment of the present invention, how the Alignment behavior acts so that a node 50 between two beams that act either both in compression or both in tension will move to straighten the two beams and decrease the angle between them. First, the strongest loaded element 51 is identified. On the side 52 of the node 50 opposite of the strongest loaded beam 51, the strongest loaded element 53 with the same force-direction (compression or tension) is identified. Unit vectors 54 and 55 along those two elements are added to arrive at the angle-bisecting vector 56. This angle-bisecting vector 56 is scaled by a global factor, "strengthAlignment" in Equation 1, as well as by the strength of the forces acting in the two elements 51 and 53 to arrive at the movement vector 57 that is the result of the Alignment behavior. This movement vector 57 attempts to push elements 51 and 53 towards the new positions 58 and 59 respectively.

In the preferred embodiment of the present invention, the Angulation behavior attempts to pull or move one beam in tension and one in compression into an angle of 0.5π, as per Equation 2.

$$behaviorAngulation = strengthAngulation \sum_{i=1}^{k-1}\sum_{j=i}^{k}(\hat{e}_i + \hat{e}_J) * (|N_i| + |N_j|) * -1 * \hat{e}_i \bullet \hat{e}_J \text{ if } ((N_i > 0) \neq (N_j > 0)) \tag{2}$$

Figure 7:
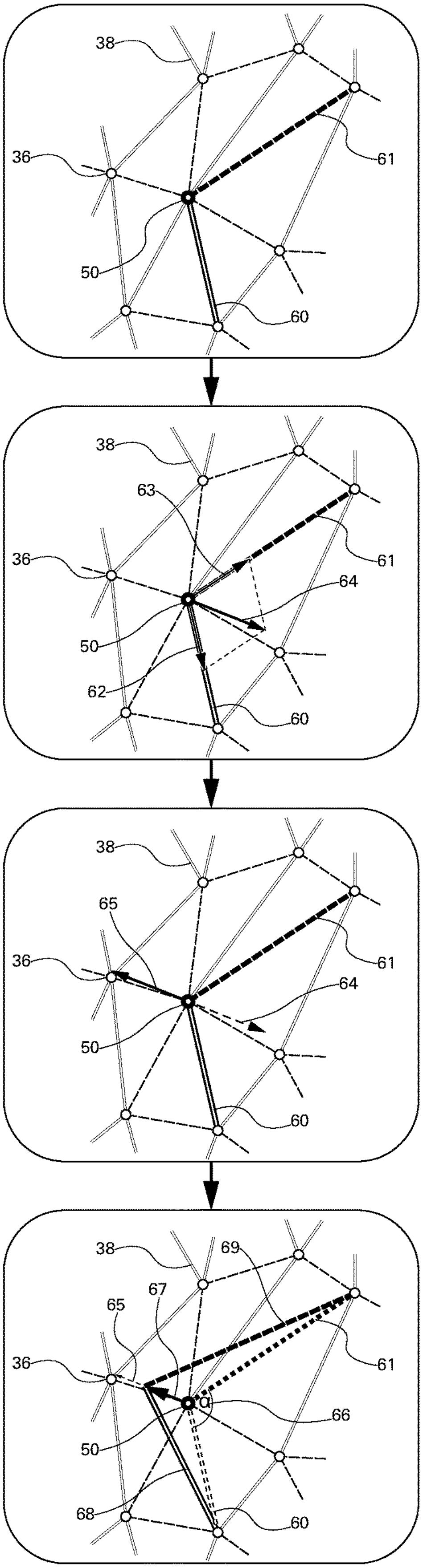
FIG. 7 is the diagram of the Angulation behavior.

FIG. 7 shows, for the preferred embodiment of the present invention, how the Angulation behavior acts so that a node 50 between two beams with one acting in compression 60 and the other in tension 61 will move to pull the beams into an orthogonal angle. The unit vectors 62 and 63 along the elements 60 and 62 are added up to arrive at the angle-bisecting vector 64. This angle-bisecting vector 64 is rotated by 180 degrees to arrive at the outward-pointing vector 65. This outward-pointing vector 65 is scaled by a global factor, "strengthAngulation" in Equation 2, according to the angle α 66, as well as by the strength of the forces acting in the two elements 60 and 61 to arrive at the movement vector 67 that is the result of the Angulation behavior. This movement vector 67 attempts to push elements 60 and 61 towards the new positions 68 and 69 respectively.

In the preferred embodiment of the present invention, the Equalization behavior attempts to equalize the lengths of two beams that act either both in tension or both in compression, as per Equation 3.

$$behaviorEqualization = strengthEqualization \sum_{i=1}^{k-1}\sum_{j=i}^{k}\overrightarrow{P - (n_i + n_J) * 0.5} * (|N_i| + |N_j|) \text{ if } ((N_i > 0) = (N_j > 0)) \tag{3}$$

Figure 8:
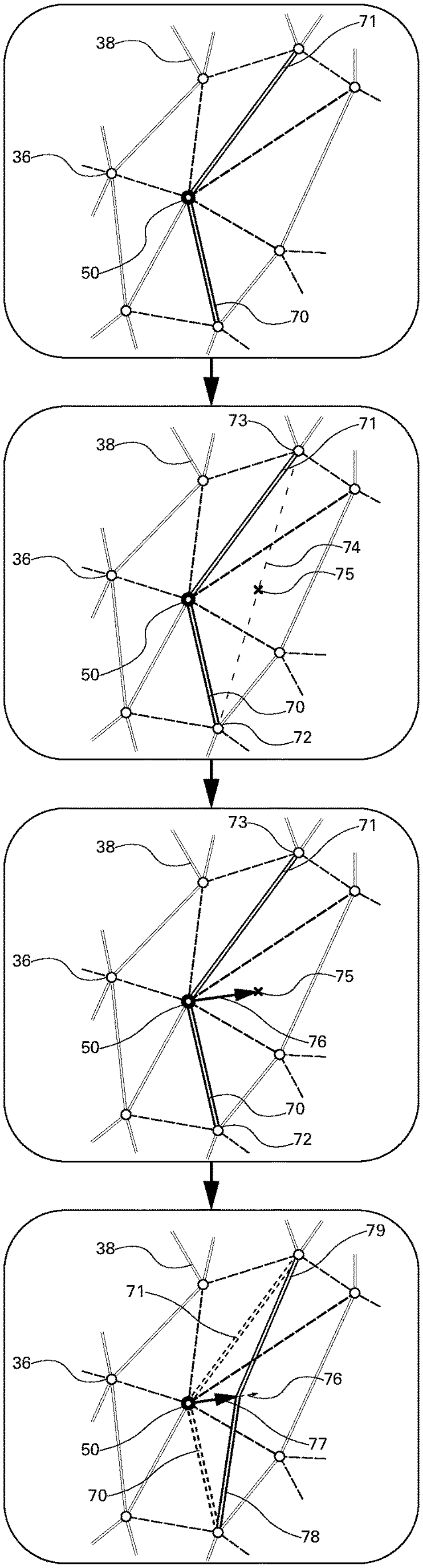
FIG. 8 is the diagram of the Equalization behavior.
Figure 9:
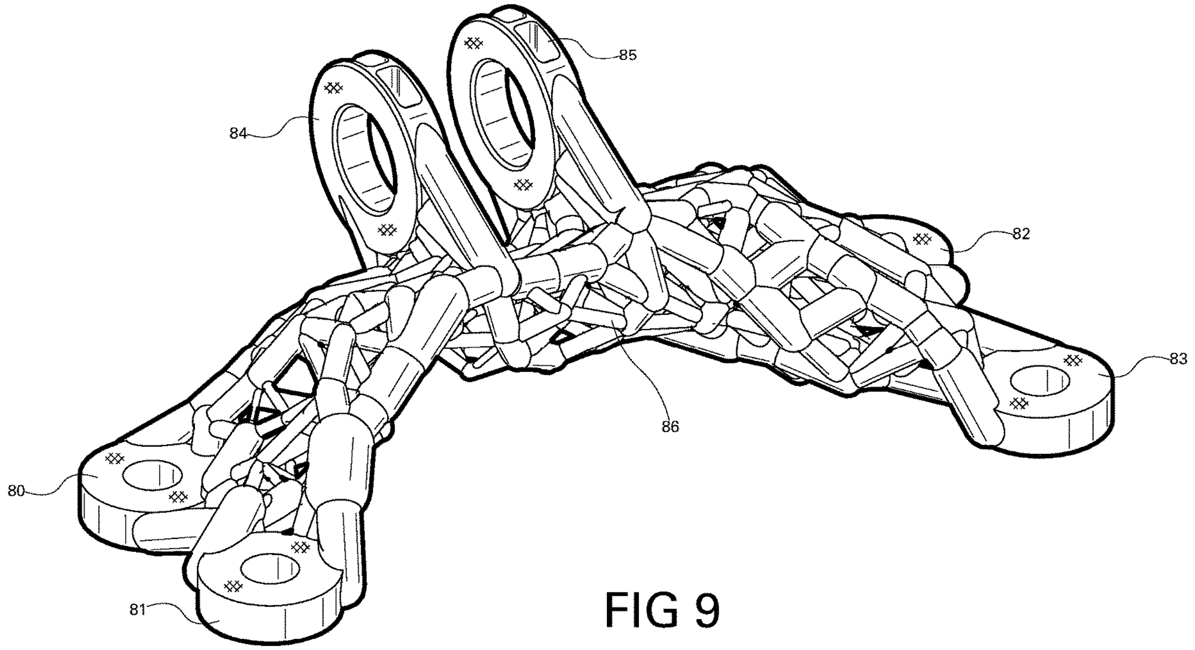
FIG. 9 is an isometric view of a 3-dimensional geometry that was generated by the preferred embodiment of the present invention. The geometry is a design for a lightweight jet engine bracket.

FIG. 8 shows, for the preferred embodiment of the present invention, how the Equalization behavior acts so that a node 50 between two beams 70 and 71 that act either both in compression or both in tension will move to equalize the length of the two beams 70 and 71. The line 74 between the end nodes 72 and 73 of the two elements 70 and 71 has the midpoint 75 between those two nodes 72 and 73. The vector 76 from the node 50 to the midpoint 75 is scaled by a global factor, "strengthEqualization" in Equation 3, as well as by the strength of the forces acting in the two elements 70 and 71 to arrive at the movement vector 77 that is the result of the Equalization behavior. This movement vector 77 attempts to push elements 70 and 71 towards the new positions 78 and 79 respectively.

The method described herein may be implemented on a computer processor and stored as instructions on a non-transitory computer-readable medium. The resulting truss design may be embodied, in part or as a whole, as a physical structure constructed in accordance with the adjusted design. The physical structure may, in part or as a whole, be used for load-bearing applications.

What is claimed is:

1. A method for adjusting the design of a structure subjected to at least one load and supported by at least one support, said structure being representable as a truss comprising at least four nodes selected from moment-resisting nodes and non-moment-resisting nodes, and at least six linear structural elements each connecting two of said nodes, the method comprising:

(i) receiving a definition of a structural design task including said at least one load and said at least one support;

(ii) receiving a definition of said truss; and (iii) executing at least two cycles, each cycle comprising:

(a) at least one step of topology adjustment, wherein at least one new node is inserted into said truss and connected by linear structural elements to one or more of the existing nodes of the truss; and (b) at least one step of geometry adjustment, wherein at least one node of said truss is repositioned based on at least two of the following criteria:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression;

whereby the design of said structure is at least in part adjusted to reduce at least one of mass and production cost.

2. The method of claim 1, wherein the method is executed on a computer processor.

3. The method of claim 2, wherein the forces of each of the linear structural elements in each step is calculated by a Finite Element Analysis.

4. The method of claim 1, wherein a physical structure is built that has a design that is at least in part based on the resulting truss.

5. The method of claim 4, wherein said physical structure is at least in part utilized in a load-bearing application.

6. The method of claim 1, wherein in each step of geometry adjustment, said new position is adjusted by at least three of:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression.

7. The method of claim 1, wherein at least one linear structural element is removed as part of at least one step of said topology adjustment.

8. The method of claim 1, wherein the method further comprises carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

9. The method of claim 1, wherein each cycle of the at least two cycles further comprises carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

10. A structure subjected to at least one load and supported by at least one support, said structure being representable as a truss comprising at least four nodes selected from moment-resisting nodes and non-moment-resisting nodes, and at least six linear structural elements each connecting two of said nodes, the structure at least in part having been adjusted by a method comprising:

(i) receiving a definition of a structural design task including said at least one load and said at least one support;

(ii) receiving a definition of said truss; and (iii) executing at least two cycles, each cycle comprising:

(a) at least one step of topology adjustment, wherein at least one new node is inserted into said truss and connected by linear structural elements to one or more of the existing nodes of the truss; and (b) at least one step of geometry adjustment, wherein at least one node of said truss is repositioned based on at least two of the following criteria:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression;

whereby the design of said structure is at least in part adjusted to reduce at least one of mass and production cost.

11. The structure of claim 10, wherein in each step of geometry adjustment, said new position is adjusted by at least three of:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression.

12. The structure of claim 10, wherein at least one linear structural element is removed as part of at least one step of said topology adjustment.

13. The structure of claim 10, wherein the method further comprises carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

14. The structure of claim 10, wherein each cycle of the at least two cycles further comprises carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

15. A non-transitory computer-readable medium comprising instructions that when executed by a computer, at least in part adjust the design of a structure subjected to at least one load and supported by at least one support, said structure being representable as a truss comprising at least four nodes selected from moment-resisting nodes and non-moment-resisting nodes, and at least six linear structural elements each connecting two of said nodes, the instructions comprising:

(i) receiving a definition of a structural design task including said at least one load and said at least one support;

(ii) receiving a definition of said truss; and (iii) executing at least two cycles, each cycle comprising:

(a) at least one step of topology adjustment, wherein at least one new node is inserted into said truss and connected by linear structural elements to one or more of the existing nodes of the truss; and (b) at least one step of geometry adjustment, wherein at least one node of said truss is repositioned based on at least two of the following criteria:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression;

whereby the design of said structure is at least in part adjusted to reduce at least one of mass and production cost.

16. The medium of claim 15, wherein in each step of geometry adjustment, said new position is adjusted by at least three of:

i. straightening two linear structural elements that meet at said node at an obtuse angle, wherein each of the two linear structural elements shares a common axial loading type selected from tension and compression, ii. moving two linear structural elements that meet at said node towards an orthogonal angle, wherein the two linear structural elements have opposing axial loading conditions, a first linear structural element being under tension and a second linear structural element being under compression, and iii. reducing a difference in length between two linear structural elements that meet at said node, wherein each of the two linear structural elements shares a common axial loading type selected from tension and compression.

17. The medium of claim 15, wherein at least one linear structural element is removed as part of at least one step of said topology adjustment.

18. The medium of claim 15, wherein the instructions further comprise carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

19. The medium of claim 15, wherein each cycle of the at least two cycles further comprises carrying out an additional step of sizing adjustment, wherein each linear structural element is subjected to one of:

(a) assigning a cross-section to the linear structural element, wherein the cross-section comprises at least a cross-section geometry and a material definition; and (b) removing the linear structural element from the truss.

* * * * *